United States Patent [19]

Cusano et al.

[11] 4,118,758

[45] Oct. 3, 1978

[54] PHOTOFLASH LAMP ARRAY HAVING HIGH VOLTAGE SHORTING TYPE FLASH LAMPS AND RADIATION SENSITIVE SWITCHING ELEMENTS

[75] Inventors: Dominic A. Cusano, Schenectady; Harold F. Webster, Scotia, both of N.Y.

[73] Assignee: General Electric Company, Schenectady, N.Y.

[21] Appl. No.: 822,449

[22] Filed: Aug. 8, 1977

[51] Int. Cl.² ............................................. G03B 15/02
[52] U.S. Cl. ......................................... 362/6; 362/11; 362/227
[58] Field of Search ............................. 362/11, 227, 6

[56] References Cited

U.S. PATENT DOCUMENTS 3,956,625  5/1976  Anderson ............................... 240/1.3

Primary Examiner—Stephen J. Lechert, Jr.
Attorney, Agent, or Firm—John F. McDevitt; Lawrence R. Kempton; Frank L. Neuhauser

[57] ABSTRACT

Radiation sensitive switches which undergo thermal decomposition to physically interrupt the circuit path when activated are operatively associated with a plurality of high voltage flash lamps utilizing a shorting primer material to provide an electrical path across said lamps after flashing as the means of enabling the flash lamps to be sequentially flashed in a high-voltage activated multiple flash lamp array. The thermal decomposition of the radiation sensitive switching elements produces self-destruction of the switch elements per se and which can be accompanied by further destruction of the underlying substrate on which the switch elements have been deposited. The switching elements are deposited on a circuit board member and electrically connected in the sequential lamp firing circuitry at circuit board locations adjacent to the associated flash lamps. The desired thermal action accompanying switch operation is enhanced in a preferred embodiment by constructing the circuit board from an organic polymer material which melts or decomposes and locating the switching elements at circuit locations wherein the underlying substrate has a thickness less than the substrate thickness elsewhere in order to produce holes in the circuit board member itself as the means of permanently interrupting the electrical path.

9 Claims, 3 Drawing Figures

PHOTOFLASH LAMP ARRAY HAVING HIGH VOLTAGE SHORTING TYPE FLASH LAMPS AND RADIATION SENSITIVE SWITCHING ELEMENTS

CROSS REFERENCE TO RELATED APPLICATIONS

A related high voltage type flash lamp array system is disclosed in co-pending patent application Ser. No. 567,576, filed Apr. 14, 1975, in the name of Vaughn C. Sterling et al and assigned to the assignee of the present invention. In said high voltage flash lamp array system, there is employed a type flash lamp construction providing an electrical short circuit condition between the lead-in wires upon flashing together with radiation-sensitive switching elements operatively associated therewith to interrupt the electrical circuit path upon actuation. The particular switching elements employed therein are characterized by exhibiting low electrical resistance when the high voltage firing pulse is applied across an unflashed lamp but undergo physical alteration in a switching material as a means of providing the desired open circuit condition when actuated by the radiant energy being emitted from an adjacent flash lamp. In further related co-pending patent application Ser. No. 799,681, filed May 23, 1977, in the name of Vaughn C. Sterling et al. and also assigned to the present assignee, there is disclosed a different type high voltage flash lamp array system utilizing a flash lamp construction desirably providing an open circuit condition after flashing but further utilizing fuse elements deposited on the associated circuit board member which interrupts the circuit path when actuated by radiation being emitted from the adjacent flash lamps. Said fuse elements also exhibit a relatively low electrical resistance up to approximately 1,000 ohms before actuation but exhibit an electrical resistance across the interrupted circuit path after actuation of at least $10^8$ ohms and comprise a mass of adherent radiation absorbing material deposited on the circuit pattern of an associated circuit board member at locations sufficiently approximate to flash lamps to be actuated by the emitted radiation for disruption of the electrical connection to the actuating flash lamp.

BACKGROUND OF THE INVENTION

Various means are known to sequentially fire a high voltage type photoflash lamp array utilizing a circuit board member having the firing circuitry deposited directly thereon. The use of radiation-sensitive switches and fuse elements connected in said circuitry is also known. A photoflash unit of this general type is described in U.S. Pat. No. 3,894,226, issued July 8, 1975, to James M. Hanson, wherein the particular flash lamps employed provide an open circuit condition between the lead-in wires upon flashing and radiation-sensitive switches permit the next lamp to be flashed. In the aforementioned co-pending application Ser. No. 567,576 an alternative lamp sequencing arrangement is disclosed wherein the flash lamp construction employs a shorting primer material including combustion supporting oxides to establish a sufficient conducting path across the lamp in-leads for the shorted lamp to function thereafter as a conducting element in the flash sequencing circuit. The circuit board member operatively associated with said flash lamps further includes low resistance radiation-sensitive switching devices connected in series with each lamp to open the electrical circuit upon flashing the associated lamp and thereby avoid short circuiting of the high voltage energy source when successive lamps are flashed in the firing sequence.

SUMMARY OF THE INVENTION

It is a primary object of the present invention to provide an improved high voltage activated multiple flash lamp array utilizing radiation-sensitive switches to physically interrupt the circuit path to an actuating flash lamp by thermal decomposition for a more reliable lamp firing sequence to take place.

Another important object of the invention is to provide an improved high voltage activated multiple flash lamp array utilizing radiation-sensitive switching elements in combination with shorting type high voltage flash lamps to physically interrupt the circuit path of an associated circuit board by thermal decomposition of the underlying circuit pattern.

Still a further important object of the invention is to provide an improved high voltage activated multiple flash lamp array of the particular type above defined wherein the dielectric substrate of the associated circuit board member is constructed from an organic polymer material and the radiation-sensitive switches are deposited at circuit board locations wherein said dielectric substrate has a thickness less than a substrate thickness elsewhere so that thermal decomposition of the actuated switching elements produces holes or openings in said dielectric substrate for permanent disruption of the electrical circuit path.

These and other objects of the present invention are achieved with a lamp firing circuit pattern having radiation-sensitive switches connected in said circuitry which undergo conversion from a low electrical resistance to a high electrical resistance by exothermic reaction of the switch material and which can be accompanied by a thermal destruction of the underlying substrate on which said switching elements are deposited. Specifically, a high-voltage activated multiple flash lamp array is employed utilizing a circuit board member with the lamp firing circuit pattern deposited on a dielectric substrate and radiation-sensitive switches connected in said circuitry for sequential firing of a plurality of flash lamps connected thereto, wherein said flash lamps each include flash ignition means in the form of a pair of spaced apart in-leads having a mass of primer material connected between said in-leads which ignites responsive to application of a high voltage firing pulse thereto and forms a conductive residue upon combustion to provide an electrical path in the connecting in-leads and with said flash lamps activating radiation-sensitive switches located adjacent thereto which are connected in said circuit pattern to physically interrupt the circuit path to the actuating flash lamp by thermal decomposition. In a preferred embodiment, the radiation-sensitive switches are deposited on the circuit pattern itself and the exothermic conversion of the switch material is sufficient to thermally decompose the underlying circuit pattern. In a different preferred embodiment, the radiation-sensitive switches are deposited on the dielectric substrate interconnecting a pair of spaced apart terminals of the circuit board pattern and thermally decompose the underlying dielectric substrate. The vigorous nature of the switch conversion in either embodiment is accompanied by sufficient heating and evolution of gas products to thermally decompose the underlying substrate as distinct from simply melting or self-destruction of the switch material only.

For satisfactory switching operation in a photoflash unit of this type utilizing the high voltage shorting flash lamps disclosed in the aforementioned co-pending application Ser. No. 567,576 along with the firing pulse energy source considerations described therein, it is required that the radiation-sensitive switching elements exhibit certain electrical characteristics including a relatively low electrical resistance up to approximately 1,000 ohms before actuation but exhibit an electrical resistance across the interrupted circuit path after actuation of at least $10^6$ ohms or greater. Such electrical requirements can be met with a switch material composition which comprises a physical mixture of radiation-absorbent particulate solids dispersed in an organic polymer binder by selecting an electrically conductive substance such as graphite or finely divided metals in the proper amount as the particulate solids in this type switching material. A different type switch material composition having the required electrical characteristics before conversion can also be used wherein the active switch material undergoes an exothermic chemical conversion responsive to the radiant energy being emitted from an adjacent flash lamp and with said switch material further exhibiting a lower breakdown voltage than the actuating flash lamp so that the desired lamp firing sequence will be achieved when the firing pulse is applied to the associated firing circuitry. Accordingly, a switch material of the latter type can comprise a mixture of silver oxide and cuprous oxide as the active constituents which is dispersed in an organic polymer binder to provide an adherent mass for deposition on the circuit board in a manner to be more fully described below.

DESCRIPTION OF THE PREFERRED EMBODIMENTS

Figure 1:
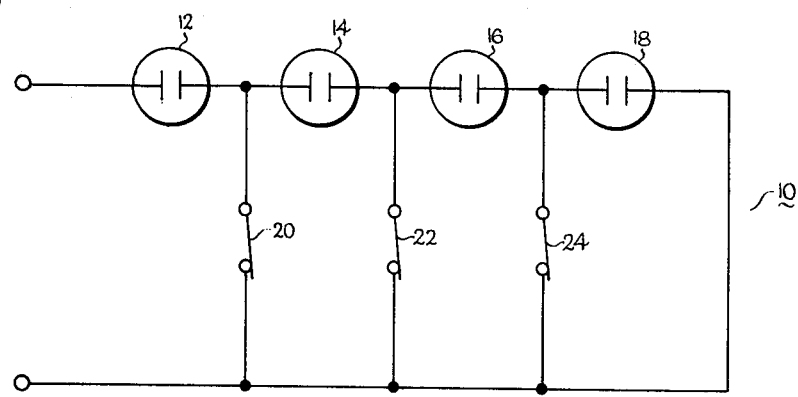
FIG. 1 is a schematic electrical diagram for a high-voltage activated multiple flash lamp array according to the present invention.

The electrical circuit configuration depicted in FIG. 1 is generally the same as that disclosed in the aforementioned Ser. No. 567,576 application wherein the lamp firing circuit pattern is deposited on a dielectric substrate in the form of a circuit board member which is desirably constructed from an organic polymer material which can undergo localized thermal decomposition responsive to switch actuation in accordance with the present invention. Such circuit board member (not shown) includes electrical connector tabs at each end for insertion of the circuit board in an associated camera socket. The camera socket contacts conductor lines in the firing circuit pattern in order to fire a group of four lamps in sequential fashion which are oriented furthest away from the camera lens. This generally defined lamp sequencing arrangement eliminates or reduces the undesirable "red-eye" effect and need not be further described in the present application to understand the herein contemplated cooperation between the individual flash lamps and switching elements. Accordingly, there is shown in FIG. 1 an electrical circuit pattern 10 having flash lamps 12–18 electrically connected in branch circuits to assure that the branch circuit of each lamp will become an open circuit upon the flashing of the lamp in that circuit. The desired mode of operation is carried out starting with the leftmost branch circuit when the lamp 12 in said circuit is flashed and causes switching element 20 in the same branch circuit to physically interrupt the circuit path to said lamp upon switch actuation which is responsive to the radiant energy being emitted from said actuating flash lamp. The thermal decomposition of switching element 20 from a condition of low electrical resistance to a condition of high electrical resistance is further accompanied by creating an electrical path between the in-leads of flashed lamp 12 to enable the next adjacent branch circuit in the firing circuit to be flashed in the same manner. The application of a subsequent high voltage firing pulse will thereby flash lamp 14 and simultaneously actuate switching element 22 in the next adjacent branch circuit in order to establish the needed circuit path for sequential firing of the branch circuit containing lamp 16 and switching element 24. As can be noted, the last branch circuit containing lamp 18 in the four-lamp grouping depicted does not require a switching element to be flashed in the desired sequence.

Figure 2:
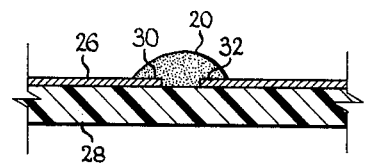
FIG. 2 is a cross-sectional view of one type switching element construction which can be employed in the electrical circuit of FIG. 1.

A more detailed description of a typical switching element 20 is depicted in FIG. 2. Said switching element comprises a mass of the switch material composition which has been deposited on circuit pattern 26 overlying circuit board member 28. Said mass of switch material bridges across and interconnects a pair of spaced apart terminals 30 and 32 of the circuit board pattern for interruption of the circuit path upon actuation and in a manner which includes thermal decomposition of the underlying dielectric subtrate. The switch material composition for use in this manner desirably undergoes thermal decomposition by an exothermic chemical reaction which can be achieved with silver oxide alone or mixtures of silver oxide and cuprous oxide that are adhesively bonded to the substrate with an organic polymer binder. The copper oxide constituent in said switch material composition further desirably lowers the voltage breakdown characteristic of the switching element so that the major portion of the applied firing pulse will be applied across the in-leads of actuating lamp 12. Switch material compositions containing weight ratios of 75% silver oxide with 25% cupric oxide or 65% silver oxide with 35% cuprous oxide that had been adhesively bonded to the substrate with an organic polymer binder produce such desired exothermic interruption of the circuit path.

Figure 3:
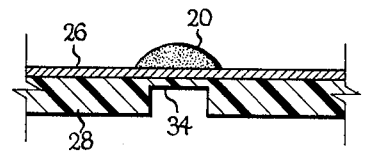
FIG. 3 is a cross-sectional view of a different switch configuration which can be employed in the electrical circuit of FIG. 1.

An alternate switch configuration as shown in FIG. 3 wherein said switching element 20 is deposited on the uninterrupted circuit pattern 26 overlying the dielectric substrate 28 of the circuit board member. Said switching element has further been deposited at a location 34 wherein said dielectric substrate has a thickness less than the substrate thickness elsewhere to enhance interruption of the circuit path upon switch actuation by producing a hole through the entire composite medium. A satisfactory switch material composition providing this mode of operation by absorption of the radiant energy being emitted from adjacent flash lamp 12 comprises approximately 35% by weight acetylene black mixed with a conventional liquid adhesive which hardens to a solid at ordinary temperatures. The desired lower electrical resistance of switch element 20 before actuation as compared with the electrical resistance of unfired associated flash lamp 12 (see FIG. 1) can further be facilitated by incorporating still other conductive particulate solids, such as cuprous oxide, in the switch material composition.

While preferred embodiments of the invention have been shown and described, various other embodiments and modifications thereof will become apparent to persons skilled in the art. For example, the invention can also be embodied in planar-type multiple flash lamp units having a different number of lamps than are specifically disclosed and to even include a unit having a group of lamps arranged to illuminate in one direction with another group of lamps being arranged to illuminate in the opposite direction. It is intended, therefore, to limit the present invention only by the scope of the following claims.

What we claim as new and desire to secure by Letters Patent of the United States is:

1. A high-voltage activated multiple flash lamp array utilizing a circuit board member with a lamp firing circuit pattern deposited on a dielectric substrate and radiation-sensitive switches connected in said circuitry for sequential firing of a plurality of flash lamps connected thereto, the improvements wherein said flash lamps each include flash ignition means in the form of a pair of spaced apart in-leads having a mass of primer material including combustion supporting oxide connected between said in-leads which ignites responsive to application of a high-voltage firing pulse thereto and forms a conductive residue upon combustion to provide an electrical path interconnecting said in-leads and with said flash lamps activating radiation-sensitive switches located adjacent thereto which are connected in said circuit pattern to physically interrupt the circuit path to the activating flash lamp by thermal decomposition.

2. A multiple flash lamp array as in claim 1, wherein the radiation-sensitive switches are deposited on the circuit pattern and thermally decompose the underlying circuit pattern.

3. A multiple flash lamp array as in claim 1, wherein the radiation-sensitive switches are deposited on the dielectric substrate interconnecting a pair of spaced apart terminals of the circuit board pattern and thermally decompose the underlying dielectric substrate.

4. A multiple flash lamp array as in claim 1, wherein the dielectric substrate is an organic polymer and the radiation-sensitive switches are deposited at circuit board locations wherein said dielectric substrate has a thickness less than the substrate thickness elsewhere.

5. A multiple flash lamp array as in claim 1, wherein the radiation-sensitive switches comprise a mass of radiation-absorbent material adhesively bonded to the circuit pattern.

6. A multiple flash lamp array as in claim 5, wherein the radiation-sensitive switches comprise a mixture of radiation-absorbent particulate solids dispersed in an organic polymer binder.

7. A multiple flash lamp array as in claim 1, wherein the radiation-sensitive switches undergo an exothermic chemical conversion from a condition of low electrical resistance to a condition of high electrical resistance.

8. A multiple flash lamp array as in claim 7, wherein the radiation-sensitive switches include silver oxide dispersed in an organic polymer binder.

9. A multiple flash lamp array as in claim 8, wherein the radiation-sensitive switches include a mixture of silver oxide and cuprous oxide dispersed in an organic polymer binder.

* * * * *